Nov. 26, 1968 YASUO EBISAWA 3,412,456
PRODUCTION METHOD OF SEMICONDUCTOR DEVICES
Filed Dec. 9, 1965 2 Sheets-Sheet 1

INVENTOR
YASUO EBISAWA

BY Paul M. Craig, Jr.
ATTORNEY

Nov. 26, 1968 YASUO EBISAWA 3,412,456

PRODUCTION METHOD OF SEMICONDUCTOR DEVICES

Filed Dec. 9, 1965 2 Sheets-Sheet 2

INVENTOR
YASUO EBISAWA

BY Paul M. Craig, Jr.
ATTORNEY

United States Patent Office 3,412,456

Patented Nov. 26, 1968

3,412,456
PRODUCTION METHOD OF SEMICONDUCTOR DEVICES

Yasuo Ebisawa, Kodaira-shi, Japan, assignor to Hitachi, Ltd., Tokyo, Japan, a corporation of Japan Filed Dec. 9, 1965, Ser. No. 512,675
Claims priority, application Japan, Dec. 17, 1964, 39/70,740
15 Claims. (Cl. 29—472.9)

ABSTRACT OF THE DISCLOSURE

A method for forming electrodes upon a silicon substrate, including the successive steps of coating a predetermined portion of the surface of the substrate with a photosensitive resist, depositing a first layer of aluminum upon the selectively-coated surface of the substrate at a temperature on the order of 550° C., depositing a second layer of aluminum upon the first layer, the deposition of the second layer being conducted at a relatively low temperature, for example about 200° C., such that the photosensitive resist is neither carbonized nor volatized, and finally, removing the photosensitive resist together with the aluminum layers formed thereon.

Figure 1:
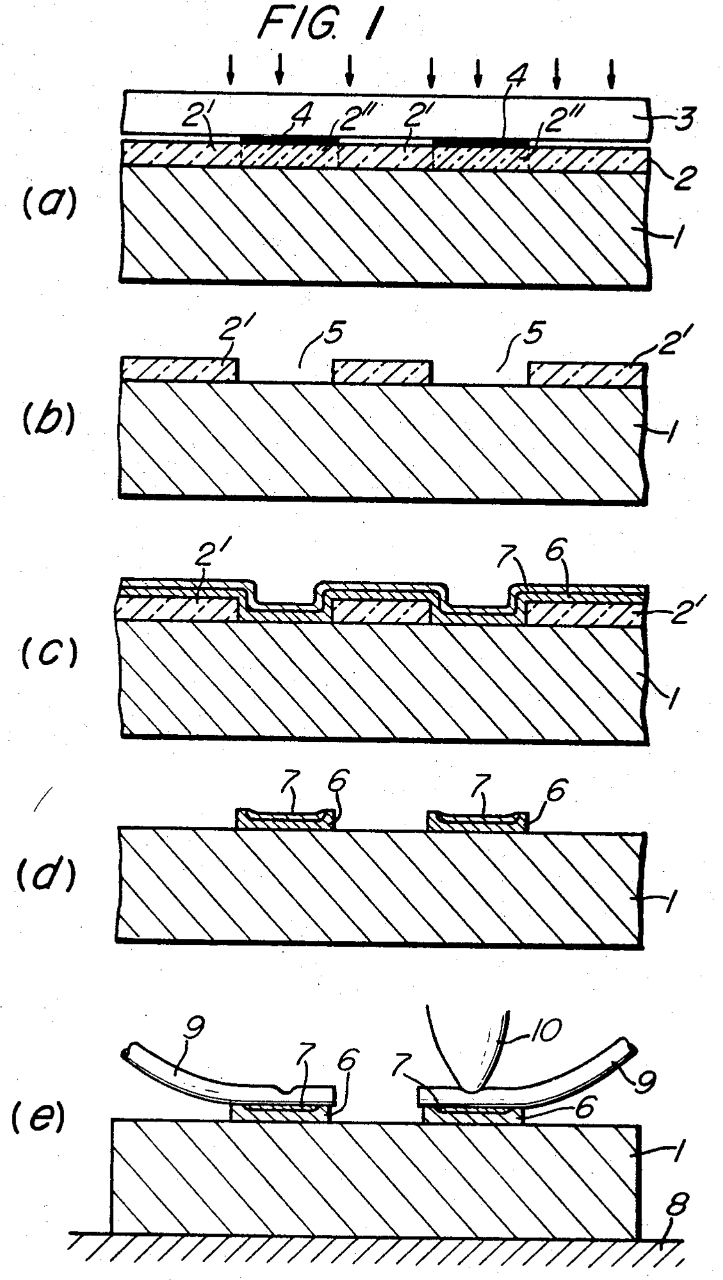

The present invention relates to methods for depositing metal layers on the selected areas of one surface of a semiconductor substrate by employing a photosensitive resist as a masking medium.

By coating one surface of a substrate with a photosensitive resist, exposing the resist to light through a stencil having a suitable pattern, and developing the resist, the surface of the substrate is exposed in the desired configuration corresponding to the pattern. Then, by forming a metal layer by evaporating or sputtering the metal onto the whole areas of the surface of the remaining resist and the exposed surface of the substrate, and then removing the resist and, at the same time, the metal layer coated on the resist, a metal layer of a desired configuration is formed on the surface of the substrate. A technique in which such a photosensitive resist is employed as a masking medium is disclosed by L. Maissel et al. in IRE Transactions on Component Parts, pages 70–79, July 1961. In a production of semiconductor devices also, it is a usual practice to form micro electrodes on the surfaces of semiconductor substrates by making use of this kind of technique.

Aluminum is usually employed as a contact metal for semiconductor devices made of silicon. Gold is limited in its application on account of its poor ability to bond with silicon.

In the production of planar transistors, by employing a layer of insulating material covering one surface of a semiconductor substrate, for example, a mask layer of silicon dioxide formed by oxidizing the substrate when the substrate is made of silicon, a base region and an emitter region are formed sequentially by selectively diffusing conductivity-type-determining-impurities into the silicon substrate through openings formed in the dioxide layer, and then aluminum contacts are attached to the base and emitter regions through the openings. The selective removal of the dioxide layer is usually effected by the photo-engraving technique. For the formation of the contacts, a method in which a photosensitive resist is employed as a masking medium is applied. More specifically, in order to expose the areas of the surface of silicon to which the contacts are to be attached, a layer of the photosensitive resist is deposited on the dioxide layer covering the silicon substrate surface, the resist being exposed to light through a stencil having a predetermined negative pattern, and then the resist is developed to expose the areas of the dioxide layer to be removed. The exposed areas of the dioxide layer are removed by an appropriate etchant to expose the substrate surface, and then the aluminum is evaporated onto the entire area covering the surface of the resist layer remaining on the dioxide layer and the exposed substrate surface. At the time when aluminum is evaporated, the silicon substrate has usually been heated to a predetermined temperature for the reasons set forth below.

First, on the occasion when the unexposed areas of the resist are dissolved in a developer by dipping the substrate having the exposed resist coating into the developer, the dissolved resist tends to adhere to the substrate surface to form an oily film. This film harms the bonding between the substrate silicon and the evaporated aluminum. It has been known that this oily film is volatilized by heating to at least 275° C. or, when occasion demands, 400° to 600° C. Consequently, the substrate has usually been heated for the purpose of volatilizing the oily film. Second, it has been known that the adhesive force between aluminum and the silicon substrate is stronger when the temperature at which aluminum is evaporated is higher.

For these reasons, the silicon substrate is heated to a temperature near the eutectic temperature (577° C.) of aluminum and silicon, for example 550° C., and then aluminum is vacuum deposited on the substrate maintained at that temperature. An unnecessary aluminum layer deposited on the photosensitive resist is removed accompanying the removal of the resist. In this manner, the contacts of the predetermined configurations are formed on the substrate. Then, connector wires are attached to these contacts.

On the other hand, if heated to about 500° C. or above, the photosensitive resist will be carbonized and volatized. Consequently, if aluminum is deposited, as described above, onto the substrate maintained at 550° C., the resist material is carbonized and volatized from the substrate surface. The carbonized resist material again deposits, together with aluminum vapor, on the substrate surface, and hence the deposited aluminum layer will be colored black. Thus, the bonding betweent the aluminum contacts and the connectors have been unsatisfactory owing to the carbonized resist material.

Therefore, the principal object of the present invention is to provide a method of evaporating a metal onto selected areas of a semiconductor substrate surface, employing a photosensitive resist as a masking medium, wherein a metal layer free of carbonized resist material is formed to facilitate the connection with connector wires and, at the same time, the weakening of bonding between the substrate and the metal contact is prevented by maintaining the substrate at a high temperature.

According to the present invention, a quantity, for example about 50–80% of a predetermined quantity to be deposited, of metal is evaporated at a relatively high temperature necessary for the bonding with the surface of the semiconductor substrate, and the remaining 50–20% of metal is evaporated at a temperature at which the above-mentioned photosensitive resist is not carbonized and volatilized. Consequently, being evaporated at a relatively high temperature, the portion of the metal contact contacting the semiconductor substrate, adheres to the substrate firmly, whereas the surface portion of the contact, being formed of clean metal, is satisfactory in its bonding with a connector.

Figure 2:
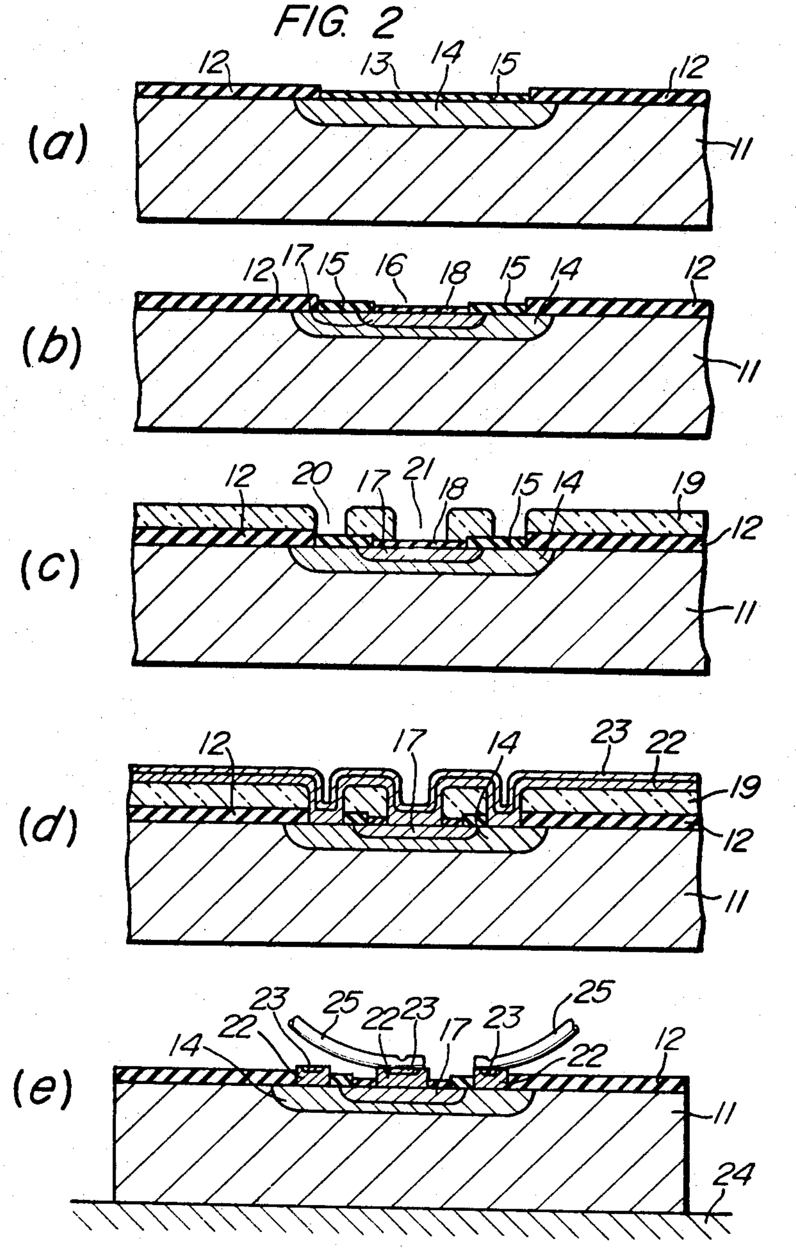

For a more thorough understanding of the present invention, a detailed description will be given with reference to the accompanying drawings in which:

FIGS. 1(*a*) to 1(*e*) are sectional views of various steps of the production of a semiconductor device as an embodiment of the present invention; and FIGS. 2(*a*) to 2(*e*) are diagrams similar to FIGS. 1(*a*) to 1(*e*) when the present invention is applied to the production of a planar type transistor.

Now referring to FIGS. 1(*a*) to 1(*e*) showing the principle of the production process according to the present invention, reference numeral 1 designates a silicon substrate, 2 is a photosensitive resist, 3 is a stencil made of glass, 4 is opaque portions formed on a surface of the stencil, which form a predetermined electrode pattern, 5 is openings extending to the substrate, formed in the resist layer, 6 and 7 are aluminum layers evaporated according to the present invention, 8 is an electroconductive support, 9 is connector wires made of gold, and 10 is a stylus for thermo-compression bonding.

The layer of photosensitive resist 2 is coated on the silicon substrate 1 to a thickness of from several thousand Angstroms to several microns, as shown in FIG. 1(*a*), and then is dried to a hardened state. The dried resist layer 2 is exposed to light through the stencil 3 put thereon. In FIG. 1(*a*), the exposed areas of the resist layer 2 are designated by 2' and the unexposed areas thereof are designated by 2''. As the photosensitive resist, polyvinylalcohol, KPR (Kodak Photo Resist), and KMER (Kodak Metal Etch Resist) are known, of which KPR is preferred for the production of semiconductor devices. The photo-resist is developed by dipping the photosensitized specimen in the KPR developer, or by exposing it to trichlene vapor, and is then rinsed in flowing water, and the unexposed photo-resist areas 2'' are removed to leave openings 5 extending to the silicon surface as shown in FIG. 1(*b*). Then, aluminum is evaporated onto the entire area covering the surface of the remaining photo-resist layer 2' and the exposed surface of the silicon substrate in a vacuum deposition apparatus. The aluminum is first deposited to a thickness of 2000–10,000 A. maintaining the substrate at 550° C. as shown in FIG. 1(*c*). At that time, because a carbonized photoresist volatilized from the substrate surface again deposits, mixing with aluminum vapor, onto the substrate surface, the aluminum layer 6 becomes a blackish layer containing the carbide. Nevertheless, the bonding between the aluminum layer 6 and the silicon substrate surface is sufficiently firm. Next, the temperature of the substrate is lowered to a temperature at which the photo-resist coating is not further carbonized nor further volatilized, for example 200° C., and the deposition of aluminum is further continued to form the aluminum layer 7 being 1500–6000 A. in thickness. The layer 7 is a clean aluminum layer containing no carbide. The bonding between the layers 6 and 7 is sufficiently effected at about 200° C. The total thickness of the aluminum layers 6 and 7 is preferably 4000–12,000 A. The substrate finished with the deposition process is taken out of the vacuum deposition apparatus, and the remaining photo-resist together with the aluminum layers 6 and 7 deposited thereon is removed. The removal is easily effected by lightly scratching the substrate surface with tweezers or a fine rod provided with a cotton swab on its tip usually called a Q-tip. In this manner, a plurality of contacts, being spaced from each other, consisting of the aluminum layers 6 and 7 are formed as shown in FIG. 1(*d*). Finally, as shown in FIG. 1(*e*), the substrate is cut to the predetermined dimensions and is soldered to the support 8. To each contact the connector wire 9 is attached to the portion of the aluminum layer 7 by the well-known thermo-compression bonding method. The aluminum layer 7 being clean (containing no carbide), the bonding with the wire is quite satisfactory. In FIG. 1(*e*), 10 is a pressure stylus made of diamond or the like. As the connector wire, a fine wire having a diameter of about 25$\mu$ made of gold or aluminum is suitable.

FIGS. 2(*a*) to 2(*e*) show the case wherein the present invention is applied to planar transistors. In this case, the photo-resist coating used to form the openings in the insulating layer covering the silicon substrate is employed as the masking medium. In FIG. 2(*a*), a surface of silicon substrate 11 is oxidized to form a silicon dioxide layer 12 to the thickness of several 1000 A., for example 6000 A. In this dioxide layer 12, an opening 13, extending to the silicon substrate surface 11, is formed by the well-known photo-engraving method, through which opening 13 an appropriate conductivity-type-determining-impurity is diffused into the silicon substrate 11 to form a region 14 of a conductivity type different from that of the substrate 11. The diffusion of impurity being performed in an oxidizing atmosphere, a second silicon dioxide layer 15 covering the diffused layer 14 is formed within the opening 13. Then, as shown in FIG. 2(*b*), an opening 16, extending to the diffused region 14, is formed in the second dioxide layer 15, through which opening 16 an impurity of the same conductivity type as the substrate 11 is diffused into the diffused region 14 to form another diffused region 17 of the same conductivity type as the substrate 11. During the diffusion process, a third dioxide layer is formed covering the diffused region 17 within the opening 16. In such a manner, the diffused regions 14 and 17 are formed, wherein the substrate and the region 14, the region 14 and the region 17 are respectively bounded by P–N junctions extending to the substrate surface. If the substrate 11 is assumed to be, for example, of N-type, then the region 14 is P-type and the region 17 is N-type, and a transistor, in which the N-type substrate 11 is the collector, the P-type region 14 is the base, and the N-type region 17 is the emitter, can be obtained. The portions of the junctions contacting the substrate surface are perfectly protected by the oxide layers 12 and 15.

As shown in FIG. 2(*c*), in order to form openings extending to the region 14 or 17 in the dioxide layers, openings 20 and 21 extending to the dioxide layers are formed by coating the oxide layers with a photo-resist 19, exposing the photo-resist 19 to light through a stencil as shown in FIG. 1(*a*), developing the photo-resist, and removing the unexposed areas of the photo-resist. Then, by dipping the specimen in an etchant for $SiO_2$, for example a mixture of HF and $HNO_3$, to remove the uncovered portions of the dioxide layer, openings extending to the region 14 or 17 are formed. The photo-resist layer 19, which was employed as a masking medium at the time of etching, is left as it is in order to be employed again as a masking medium for evaporation. In a similar manner as for FIG. 1(*c*), aluminum layers 22 and 23 are formed by evaporation according to the method of the present invention.

The unnecessary aluminum layer is removed together with the photo-resist to form separate contacts contacting, respectively, the regions 14 and 17 as shown in FIG. 2(*e*). The substrate 11 is then diced into elements, which are soldered to an electro-conductive support 24 which functions as a collector electrode. To each contact contacting the regions 14 and 17, a gold wire 25 is attached. The gold wire 25 being bonded with the clean aluminum layer portion 23 of the contact results in a satisfactory bonding. In this embodiment, it may be well that the dioxide layer is not necessarily that obtained by oxidizing the substrate. For example, silicon dioxide deposited from a vapor by pyrolyzing organo-oxysilane gas will do as well.

Hereinabove, the present invention has been described with reference to a limited number of embodiments. However, the present invention is not limited to such embodiments, and it is evident that various modifications and applications of the present invention are possible without departing from the spirit and the scope of the invention.

What I claim is:

1. A production method of semiconductor devices comprising the steps of:

coating a semiconductor substrate with a photosensitive resist; selectively removing said resist layer to selectively expose a surface of said substrate and to leave the remaining resist layer on said substrate;

depositing a metal from vapor phase onto said substrate covering the surface of said remaining resist layer and said exposed substrate surface; and removing said remaining resist together with the unnecessary metal layer deposited thereon to leave said metal layer on selected surface areas of said substrate;

said deposition of metal being performed in two stages wherein metal is first deposited on said substrate at a temperature which insures a satisfactory bonding between said substrate and said metal, and then the temperature of said substrate is lowered to a point at which said resist is no longer carbonized nor volatilized, said deposition of said metal being continued thereafter to form a clean metal layer free of carbonized resist on said previously-formed metal layer.

2. A production method of semiconductor devices as set forth in claim 1, further comprising the step of attaching a connector wire to said clean metal portion of said remaining metal layer.

3. A production method of semiconductor devices as set forth in claim 1, wherein said semiconductor is silicon and said metal is aluminum.

4. A production method of semiconductor devices as set forth in claim 1, wherein said metal is deposited by vacuum evaporation.

5. A production method of semiconductor devices as set forth in claim 3, wherein said aluminum is deposited by vacuum evaporation.

6. A production method of semiconductor devices as set forth in claim 3, characterized in that a gold or aluminum connector wire is attached to said clean metal portion of said remaining metal layer.

7. A production method of semiconductor devices comprising the steps of:

forming an insulating layer on a semiconductor substrate surface;

coating said insulating layer with a photosensitive resist; selectively removing said resist layer to selectively expose a surface of said insulating layer and to leave the remaining resist layer on said insulating layer;

etching off the exposed portion of said insulating layer by making use of said resist layer as a mask to form an opening extending to said semiconductor substrate surface in said insulating layer;

depositing a metal from vapor phase onto said substrate covering the surface of said remaining resist layer and said exposed substrate surface; and removing said remaining resist on said insulating layer together with the unnecessary metal layer deposited thereon to leave said metal layer on said semiconductor substrate surface within said opening selectively formed in said insulating layer.

8. A production method of semiconductor devices as set forth in claim 7, further comprising the step of attaching a connector wire to said clean metal portion of said remaining metal layer.

9. A production method of semiconductor devices as set forth in claim 7, wherein said semiconductor is silicon and said metal is aluminum.

10. A production method of semiconductor devices as set forth in claim 7, wherein said metal is deposited by vacuum evaporation.

11. A production method of semiconductor devices as set forth in claim 9, wherein said aluminum is deposited by vacuum evaporation.

12. A production method of semiconductor devices as set forth in claim 9, wherein said insulating layer is a silicon dioxide layer.

13. A production method of semiconductor devices as set forth in claim 9, characterized in that a gold or aluminum connector wire is attached to said clean metal portion of said remaining metal layer.

14. A method of producing semiconductor devices comprising the steps of:

coating one surface of a silicon substrate with a photosensitive resist layer;

selectively removing said resist layer to selectively expose said surface of said substrate and to leave the remaining resist layer on said substrate;

forming a first metal layer by depositing aluminum from vapor phase onto said substrate heated to a first temperature of 500° C. to 577° C, said first metal layer covering the surface of said remaining resist layer and said exposed substrate surface;

reducing the substrate temperature to a second temperature lower than 500° C;

forming a second metal layer by depositing aluminum from vapor phase onto said first metal layer at said second temperature; and removing said remaining resist layer together with the first and second metal layers deposited on said remaining resist layer.

15. A method of producing semiconductor devices comprising the steps of:

forming a silicon oxide layer on a surface of a silicon substrate; coating said oxide layer with a photosensitive resist layer; selectively removing said resist layer to selectively expose the surface of said oxide layer on which said resist layer is laid and to leave the remaining resist layer on said oxide layer;

etching off the exposed portion of said oxide layer by making use of said remaining resist layer as a mask to form an opening extending to said silicon substrate surface in said oxide layer;

forming a first metal layer by depositing aluminum from vapor phase onto said silicon substrate heated to a first temperature of 500° C. to 577° C., said first metal layer covering the surface of said remaining resist layer and said exposed substrate surface;

forming a second metal layer by depositing aluminum from vapor phase onto said silicon substrate heated to a second temperature lower than 500° C., said second metal layer covering said first metal layer; and removing said remaining resist layer together with the first and second metal layers deposited on said remaining resist layer.

References Cited

UNITED STATES PATENTS

| | | | |
|---|---|---|---|
| 2,849,583 | 8/1958 | Pritikin | 29—620 X |
| 2,879,188 | 3/1959 | Strull | 117—212 X |
| 2,969,296 | 1/1961 | Walsh | 117—212 X |
| 2,994,621 | 8/1961 | Hugle et al. | 117—212 X |
| 3,087,239 | 4/1963 | Clagett | 29—630 X |
| 3,170,810 | 2/1965 | Kagan | 117—212 X |
| 3,230,109 | 1/1966 | Domaleski | 117—212 |
| 3,281,815 | 11/1966 | Schramm | 29—578 |

JOHN F. CAMPBELL, *Primary Examiner.*

J. L. CLINE, *Assistant Examiner.*